(12) United States Patent
Robl et al.

(10) Patent No.: US 11,385,671 B2
(45) Date of Patent: Jul. 12, 2022

(54) ROTARY-PUSH ACTUATOR FOR ELECTRONIC DEVICE

(71) Applicant: Endress+Hauser Conducta GmbH+Co. KG, Gerlingen (DE)

(72) Inventors: Stefan Robl, Hünxe (DE); Michael Dieterich, Waiblingen (DE); Marco Bezzon, Stuttgart (DE)

(73) Assignee: ENDRESS+HAUSER CONDUCTA GMBH+CO. KG, Gerlingen (DE)

( * ) Notice: Subject to any disclaimer, the term of this patent is extended or adjusted under 35 U.S.C. 154(b) by 0 days.

(21) Appl. No.: 17/113,989

(22) Filed: Dec. 7, 2020

(65) Prior Publication Data
US 2021/0173424 A1    Jun. 10, 2021

(30) Foreign Application Priority Data

Dec. 5, 2019   (DE) ..................... 10 2019 133 185.4

(51) Int. Cl.
*G05G 1/02* (2006.01)
*G05G 1/10* (2006.01)
(Continued)

(52) U.S. Cl.
CPC .................. *G05G 1/10* (2013.01); *G05G 1/02* (2013.01); *G05G 9/047* (2013.01); *H03M 1/24* (2013.01); *G05G 2009/04755* (2013.01)

(58) Field of Classification Search
CPC ............ G05G 1/10; G05G 9/047; G05G 1/02; G05G 2009/04755; H03M 1/24
See application file for complete search history.

(56) References Cited

U.S. PATENT DOCUMENTS

| 6,686,911 B1* | 2/2004 | Levin ..................... G05G 9/047 345/156 |
| 2009/0015360 A1* | 1/2009 | North ....................... G05G 5/06 335/209 |

(Continued)

FOREIGN PATENT DOCUMENTS

| DE | 102004001592 A1 | 8/2005 |
| DE | 102006043619 A1 | 3/2008 |

(Continued)

OTHER PUBLICATIONS

EPO Machine Translation of EP2803888A1, Muller et al., Nov. 19, 2014. (Year: 2014).*

(Continued)

*Primary Examiner* — Vinh Luong
(74) *Attorney, Agent, or Firm* — Mark A. Logan; Endress+Hauser (USA) Holding Inc.

(57) ABSTRACT

An electronic device comprises a housing with a housing wall; a rotary-push actuator comprising a transmitter element arranged on a first side of the housing wall, a rotary actuator, which is rotatable around an axis of rotation, especially its longitudinal axis, wherein the rotary actuator is arranged on the first side of the housing wall, wherein the rotary actuator comprises at least one first magnetic element, which is arranged away from the axis of rotation; and an evaluation device, which is arranged on a second side of the housing wall, wherein the evaluation device is configured in such a manner that it detects an axial movement of the transmission element and/or a rotational movement of the rotary actuator relative to the evaluation device.

16 Claims, 8 Drawing Sheets

(51) Int. Cl.
    *G05G 9/047*    (2006.01)
    *H03M 1/24*    (2006.01)

(56)  References Cited

U.S. PATENT DOCUMENTS

| 2012/0256821 | A1* | 10/2012 | Olsson | G06F 3/0338 |
|---|---|---|---|---|
| | | | | 345/156 |
| 2017/0001106 | A1* | 1/2017 | Gassoway | A63F 13/24 |
| 2019/0258286 | A1* | 8/2019 | Burchard | G05G 1/12 |
| 2020/0089334 | A1* | 3/2020 | Tompkins | A63F 13/213 |

FOREIGN PATENT DOCUMENTS

| DE | 102006045735 | A1 | | 3/2008 | |
|---|---|---|---|---|---|
| DE | 19947529 | B4 | | 4/2008 | |
| DE | 102013008033 | A1 | | 11/2014 | |
| DE | 102014111712 | A1 | | 2/2016 | |
| DE | 102015116957 | A1 | | 4/2017 | |
| EP | 2803888 | A1 | * | 11/2014 | |
| FR | 3071076 | A1 | * | 3/2019 | |
| WO | WO 2012051357 | | * | 4/2012 | |
| WO | WO 2020083697 | A1 | * | 4/2020 | G05G 1/08 |

OTHER PUBLICATIONS

EPO Machine Translation of DE102004001592A1, Koenemann et al., Aug. 4, 2005. (Year: 2005).*
Machine Translation of FR3071076A1, Thorpe, Mar. 15, 2019. (Year: 2019).*

* cited by examiner

65 = magnetic sensors

ROTARY-PUSH ACTUATOR FOR ELECTRONIC DEVICE

CROSS-REFERENCE TO RELATED APPLICATION

The present application is related to and claims the priority benefit of German Patent Application No. 10 2019 133 185.4, filed on Dec. 5, 2019, the entire contents of which are incorporated herein by reference.

TECHNICAL FIELD

The present disclosure relates to an electronic device. Such an electronic device is, for example, a measuring transducer or more generally a field device. Such devices are used in process automation.

BACKGROUND

Measuring transducers and, in general, field devices generally have a display and operating elements for controlling a menu system shown on the display. Such operating elements are typically realized in the form of keys and rotary knobs. In this connection, one also speaks of rotary actuators, push-button actuators or, in a combination of these, rotary-push actuators.

The realization of a tightness (e.g., according to protection class IP67 and others) is problematic, since, here, the mechanical movement and/or rotation of the operating element must be passed on to the electromechanical component and at the same time a tight closure of the housing must be realized. A typical solution to the problem is to use suitable sealing systems (O-rings, mold seals, etc.).

Since sealing systems do not offer 100% protection against penetration of moisture into the housing and good systems result in a high structural outlay and thus high costs, alternative operating systems which dispense with mechanical actuation are realized in some cases. Examples of this are optical keys, capacitive sensors or operation by means of magnetic pins. A disadvantage of such solutions is that they typically can only implement the replacement of push buttons, but not a rotary-push actuator.

Depending on the type, the specified technologies have further disadvantages, such as the fact that they can only be used with plastic housings or behind glass (capacitive principle of operation), transparency is required (optical principle of operation), aids that can be lost are required (operation with a magnetic pin), sensitivity to moisture is present (optical and capacitive principle of operation), or that operation with gloves is severely restricted (capacitive principle).

An even greater problem arises in connection with housings that are to satisfy the requirements for explosion protection according to Ex d. In this case, a hermetically sealed housing concept is required, which housing concept must have no openings for the mechanical connection of operating elements. Housings according to Ex d are typically made of solid steel and sealed in such a manner that they can withstand high internal pressures (internal explosion). Such Ex d housings restrict the interaction possibilities between human and field device. As a rule, only optical/capacitive keys or magnetic pins can be used here. In individual cases, devices of this type can even be operated only in the open case (e.g., with so-called fire appearance in a non-ex atmosphere).

SUMMARY

The present disclosure is based on the object of proposing a simple operating concept for an electronic device, for example a measuring transducer.

The object is achieved by an electronic device comprising a housing with a housing wall; a rotary-push actuator comprising a transmitter element arranged on a first side of the housing wall, a rotary actuator rotatable about an axis of rotation, especially its longitudinal axis, wherein the rotary actuator is arranged on the first side of the housing wall, wherein the rotary actuator comprises at least one first magnetic element arranged away from the axis of rotation; and an evaluation device arranged on a second side of the housing wall, wherein the evaluation device is designed such that it detects an axial movement of the transmitter element and/or a rotational movement of the rotary actuator relative to the evaluation device.

One embodiment provides that it additionally comprises at least one second push-button actuator, separate from the rotary-push actuator, which is arranged on the first side of the housing wall.

One embodiment provides that an elastic element is arranged on the end region of the transmitter element on the housing side, especially a compression spring, for example a coil spring as a cylindrical spring or cone spring, which displaces the transmitter element axially into an initial position.

One embodiment provides that the transmitter element comprises a magnet, especially a permanent magnet, and wherein a magnetic sensor, such as a Hall effect sensor, is arranged on the second side of the housing wall and opposite the magnet and detects an axial movement, especially against a spring force, of the transmitter element.

One embodiment provides that the evaluation device comprises at least one Hall effect sensor, wherein the Hall effect sensor detects the axial movement of the transmitter element and/or the rotational movement by means of the first magnetic element.

One embodiment provides that the device comprises: a rotary disk arranged on the second side of the housing wall, wherein the rotary disk comprises at least one second magnetic element, wherein the first magnetic element and/or second magnetic element is a magnet, especially a permanent magnet, and wherein the first and second magnetic elements are arranged opposite each other and form a magnetic coupling, such that a rotation of the rotary actuator causes a rotation of the rotary disk.

In one embodiment, the rotary disk is extended into the interior of the housing. For optimum coupling, the rotary disk itself is arranged in the vicinity of the housing wall. In one embodiment, however, the rotary disk comprises an axle that is directed into the interior of the housing. In one embodiment, a further rotary disk is arranged on the end of the axle that is inside the housing. The rotary disk can also be configured as a cylinder.

One embodiment provides that the first and the second magnetic elements are configured as permanent magnets.

One embodiment provides that the rotary actuator and the rotary disk are substantially disk-shaped and in each case that a plurality of first and second magnetic elements are arranged at a regular angular distance from each other, for instance four first or second elements at an angle of 90° or six first or second elements at an angle of 60°.

One embodiment provides that the rotary disk is mounted by means of a bearing, especially by means of a ball bearing.

One embodiment provides that the evaluation device comprises at least one rotational movement sensor, wherein the rotational movement sensor detects the rotational movement of the rotary disk.

One embodiment provides that the rotary disk comprises first capacitive elements, wherein the rotational movement sensor comprises second capacitive elements, wherein the first and second capacitive elements form electrodes of a plate capacitor, wherein the evaluation device detects a change in the capacitance of the plate capacitor upon a movement of the rotary disk.

One embodiment provides that the rotary disk comprises first sliding contacts, wherein the rotational movement sensor comprises second sliding contacts, wherein the evaluation device detects a movement of the rotary disk by means of the first and second sliding contacts when they slide over each other.

One embodiment provides that the rotary disk is perforated several times along the circumference, wherein the rotational movement sensor comprises at least one light barrier, preferably two light barriers, wherein the light barrier is assigned to the through holes and is arranged in such a manner that the through holes are permeable by means of the light barrier, wherein the evaluation device detects a movement of the rotary disk by means of the through holes and the light barrier.

One embodiment provides that the through holes are configured by means of substantially cuboid blocks arranged, especially regularly, along the circumference of the rotary disk; especially, each block comprises a slotted aperture.

One embodiment provides that the rotary disk comprises a plurality of reflective elements, wherein the rotational movement sensor comprises at least one reflection light barrier, preferably at least two reflection light barriers, wherein the evaluation device detects a movement of the rotary disk by means of the reflective elements and the reflection light barrier.

One embodiment provides that the rotational movement sensor comprises at least one magnetic sensor, for example a Hall effect sensor, wherein the evaluation device detects a movement of the rotary disk by means of the second magnetic element and the magnetic sensor.

One embodiment provides that the rotary disk comprises at least one third magnetic element, especially a magnet, preferably a permanent magnet, wherein the rotational movement sensor comprises a magnetic sensor, for example a Hall effect sensor, wherein the evaluation device detects a movement of the rotary disk by means of the third magnetic element and the magnetic sensor. In the embodiment with the extension of the rotary disk into the interior of the housing, the third magnetic element is located inside the housing, that is to say on the extended part of the rotary disk.

One embodiment provides that the rotational movement sensor is configured in such a manner that a Gray encoding or an, especially digital, quadrature signal encoding can be read out.

One embodiment provides that the rotational movement sensor is configured in such a manner that an, especially analog, quadrature signal encoding can be read out.

One embodiment provides that the electronic device comprises a needle pulse generator, which controls the power supply of the magnetic sensor(s), light barrier(s) and/or reflection light barriers.

BRIEF DESCRIPTION OF THE DRAWINGS

This is explained in more detail with reference to the following figures.

DETAILED DESCRIPTION

In the figures, the same features are identified by the same reference signs.

Figure 1:
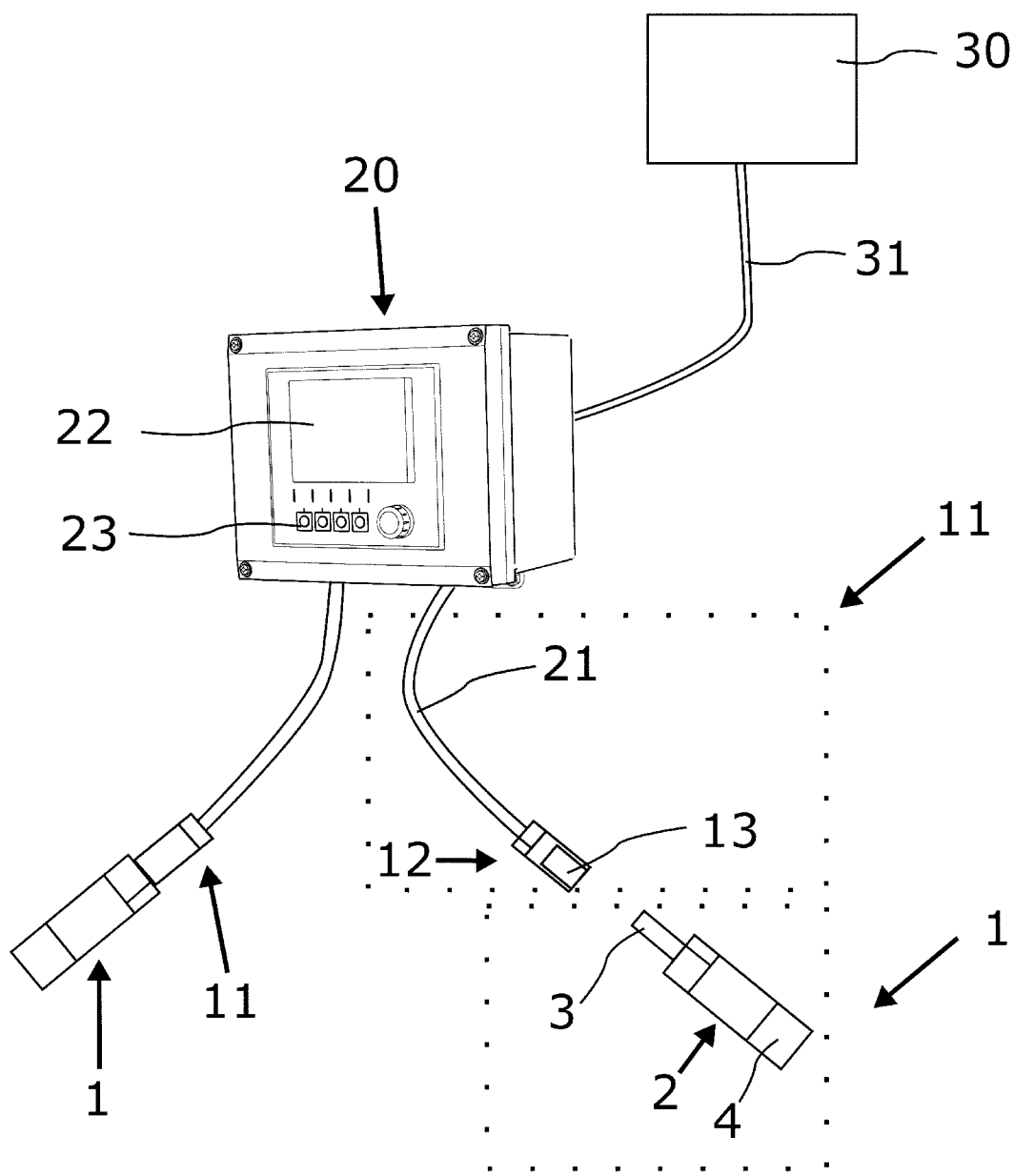
FIG. 1 shows the claimed electronic device.

The claimed electronic device in its entirety has reference sign 20 and is shown in FIG. 1. In the following, the electronic device is to be configured as a measuring transducer.

A sensor 1 communicates with the measuring transducer 20 via a first physical interface 3. The measuring transducer 20 in turn is connected to a higher-level unit 30, such as a control system, by a cable 31. A cable 21 is connected on the sensor side to the measuring transducer 20, the other end of which cable comprises a second physical interface 13 that is complementary to the first physical interface 3. A connection element 11 comprises the cable 21 along with the second physical interface 13. The physical interfaces 3, 13 are configured as galvanically isolated interfaces, especially as inductive interfaces. The physical interfaces 3, 13 can be coupled with each other by means of a mechanical plug connection. The mechanical plug connection is hermetically sealed, such that no fluid, such as the medium to be measured, air, or dust can enter from the outside.

Data (bi-directional) and energy (uni-directional, i.e., from the connection element 11 to the sensor 1) are sent or transferred via the physical interfaces 3, 13. The system 10 is used predominantly in process automation.

The sensor 1 comprises at least one sensor element 4 for detecting a measured variable of process automation. The sensor 1 is then, for example, a pH sensor, also called an ISFET design, generally an ion-selective sensor, a sensor for measuring the redox potential, the absorption of electromagnetic waves in the medium, for example with wavelengths in the UV, IR and/or visible range, oxygen, conductivity, turbidity, the concentration of non-metallic materials or the temperature with the respective measured variable.

The sensor 1 comprises a first coupling body 2, which comprises the first physical interface 3. As mentioned, the first physical interface 3 is configured for the transmission to a second physical interface 13 of a value that is a function of the measured variable. The sensor 1 comprises a data processing unit, for instance a microcontroller, which processes the values of the measured variable, for instance converts them into another data format. For reasons of energy and space, the computing capacity and storage volume of the data processing unit is rather small and economical. The sensor 1 is thus configured only for "simple" computing operations—for instance, for averaging, preprocessing, and digital conversion. The sensor 1 comprises one or more memories separately or as part of the data processing unit.

A plurality of sensors 1 can also be connected to a measuring transducer 20. FIG. 1 shows two sensors 1, wherein only one of the two is provided with all of the reference signs. The same or different sensors can be connected. The left one of the two is shown in the plugged-in state. Up to eight sensors, for example, can be connected to the measuring transducer 20.

The sensor 1 can be connected via the physical interfaces 3, 13 to the connection element 11, and ultimately to the measuring transducer 20. The data processing unit converts the value that is a function of the measured variable (i.e., the measurement signal of the sensor element 4) into a protocol that the measuring transducer 20 can understand. An example in this regard is, for example, the proprietary Memosens protocol. The first and second physical interfaces 3, 13 are thus configured for bi-directional communication between the sensor 1 and the measuring transducer 20. As mentioned, in addition to the communication, the first and second physical interfaces 3, 13 also ensure the supply of energy to the sensor 1.

The connection element 11 comprises the second physical interface 13, wherein the second physical interface 13 is configured to be complementary to the first physical interface 3.

The connection element 11 comprises a second, cylindrical coupling body 12 that is configured to be complementary to the first coupling body 2 and can be slipped with a sleeve-like end section onto the first coupling body 2, wherein the second physical interface 13 is plugged into the first physical interface 3. An opposite arrangement, in which the second physical interface 13 is configured to be sleeve-like and the first physical interface 3 is configured to be plug-like, is possible, without any inventive effort.

Figure 3A:
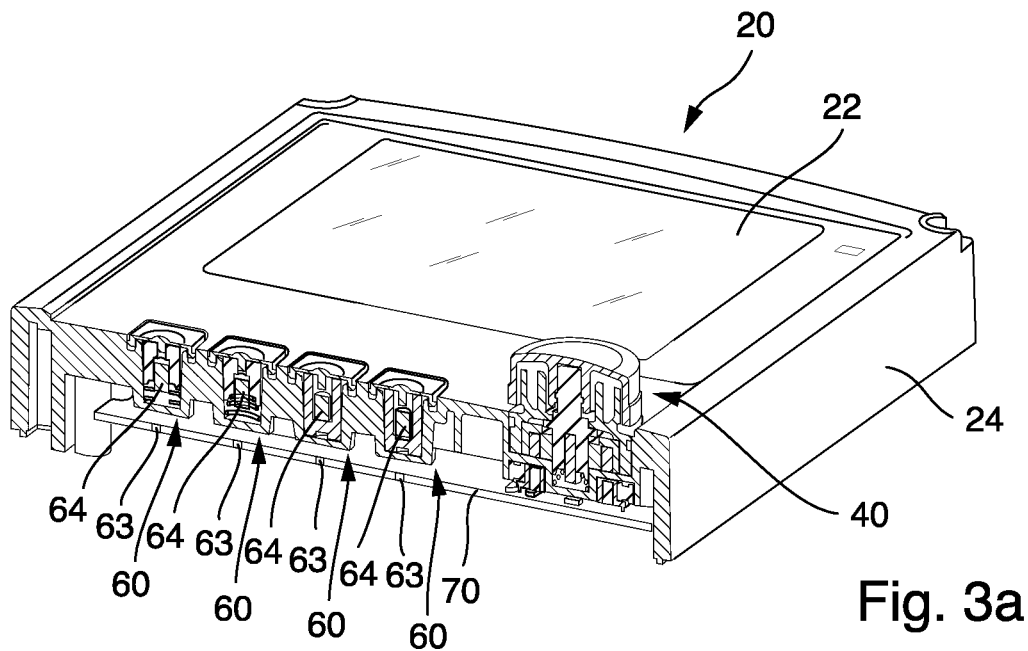
FIGS. 3a-3b show a side view of the claimed electronic device with a rotary-push actuator in a normal view and an exploded view.
Figure 3B:
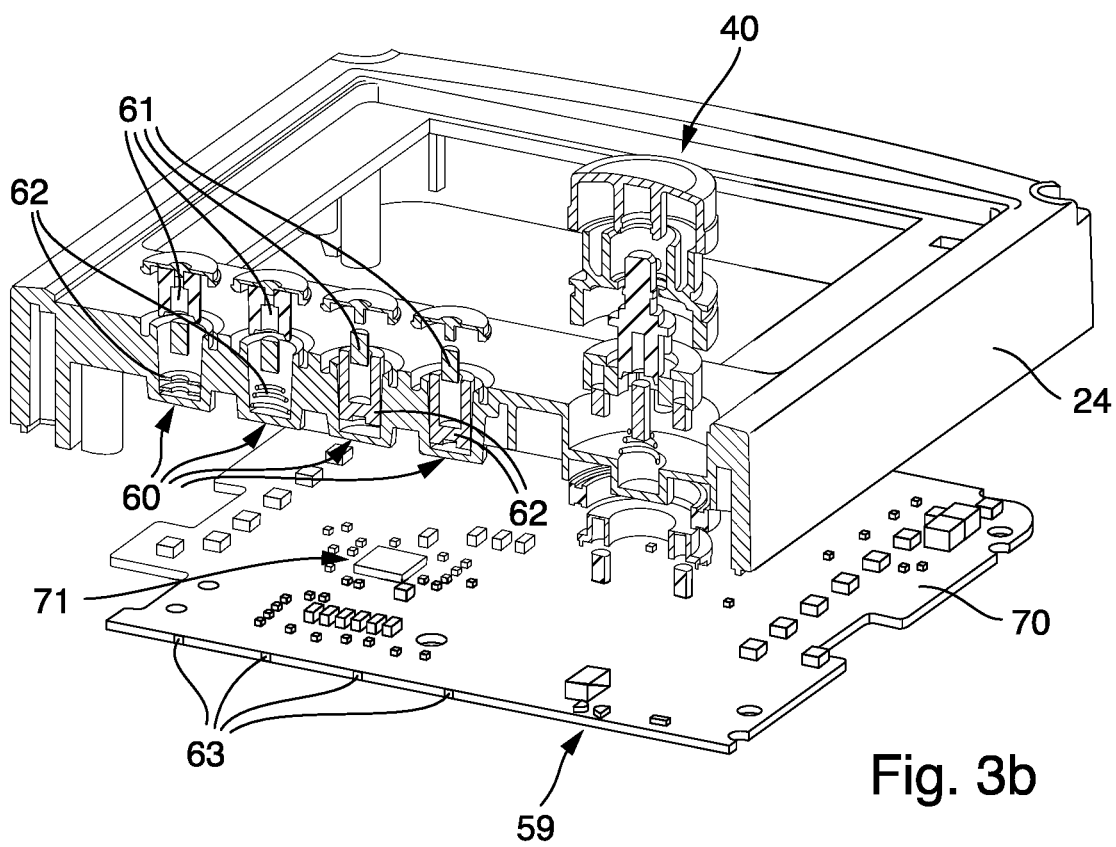
Figure 3C:
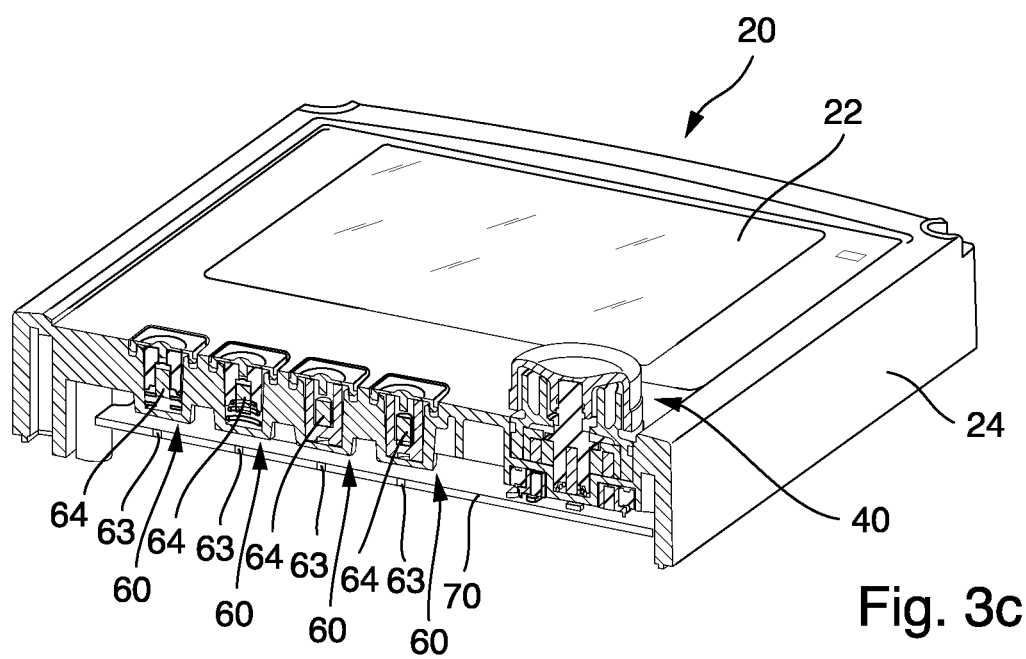
FIG. 3c shows the rotary-push actuator in a "pushed" position.
Figure 4:
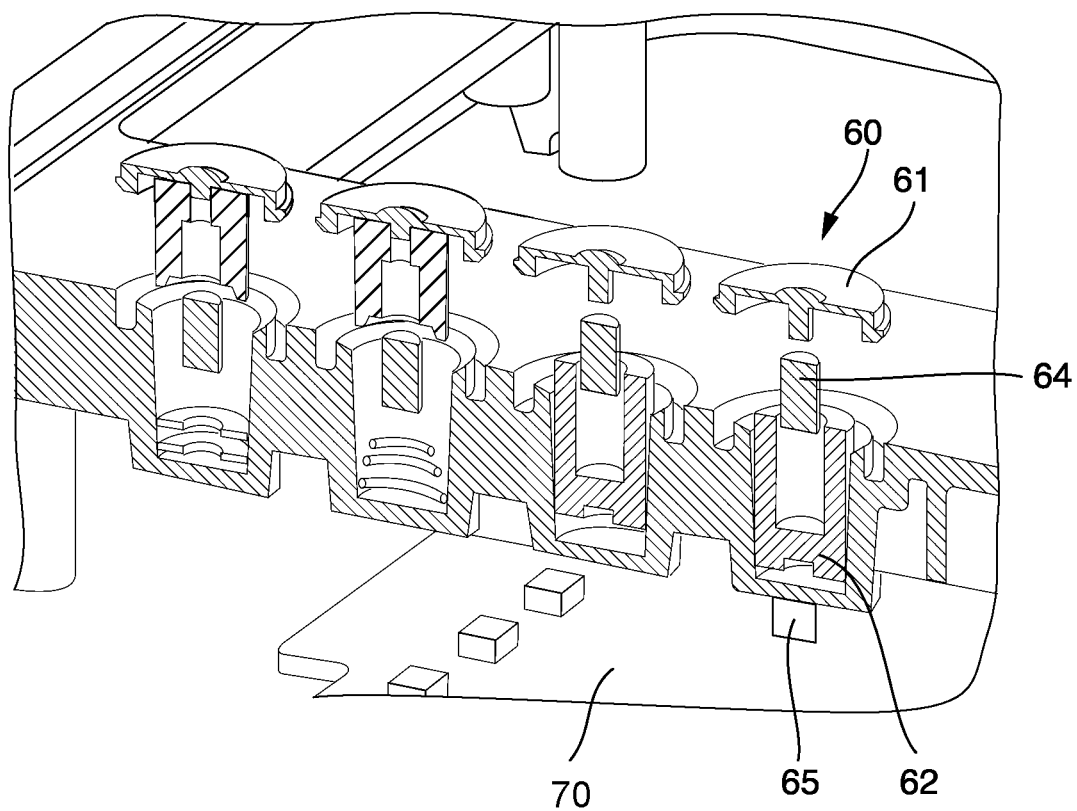
FIG. 4 shows an exploded drawings of push-button actuators on the claimed electronic device.

The measuring transducer 20 comprises a display 22 and one or more operating elements 23, for instance buttons or rotary buttons, by means of which the measuring transducer 20 can be operated. Measured data, for example, of the sensor 1 are shown by the display 22. The sensor 1 can also be configured and parameterized by means of the operating elements 23 and the corresponding view on the display 20. The operating elements are discussed below in connection with FIGS. 2 to 4.

The measuring transducer 20 forwards the measured data via the cable 31, as mentioned, to a control system 30, for example. In this case, the control system 30 is configured as a process control system (PLC, SPS), PC, or server.

For this purpose, the measuring transducer 20 converts the data into a data format that the control system can understand, for instance in a corresponding bus, such as HART, Profibus PA, Profibus DP, Foundation Fieldbus, Modbus RS485, or even an Ethernet-based field bus, such as EtherNet/IP, Profinet, or Modbus/TCP. These data are then forwarded to the control system 30. This may, if required, be combined with a web server; i.e., they may be operated in parallel with one another.

In the following, the operating elements 23 will be explained in more detail. A measuring transducer 20 comprises, for example, a rotary-push actuator 40 and a plurality of push-button actuators 60 separate therefrom; see, for instance, FIG. 3a.

Figure 2:
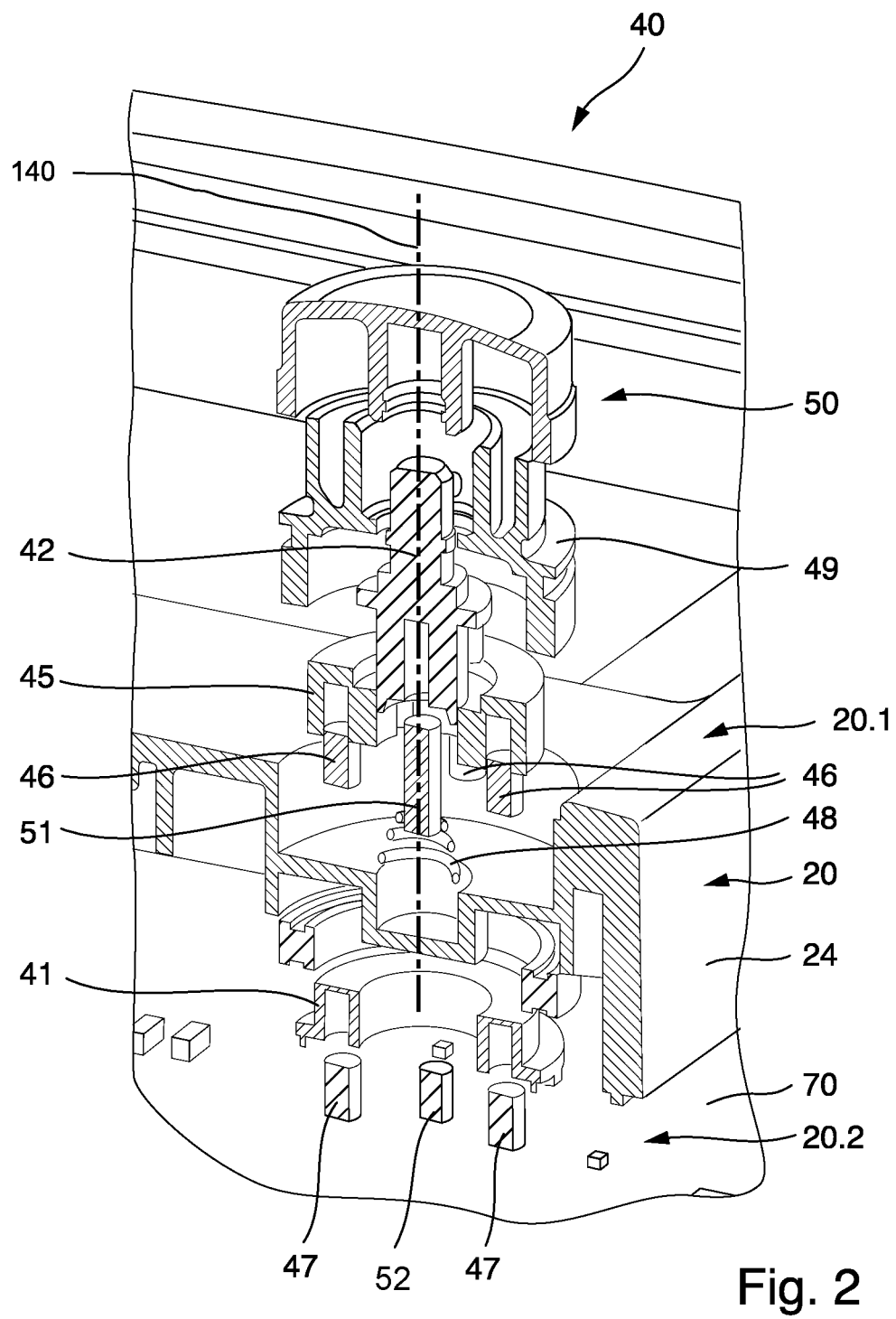
FIG. 2 shows an exploded view of the rotary-push actuator.

FIG. 2 shows such a rotary-push actuator 40 in a sectional drawing in an exploded view. By rotating the rotary-push actuator 40, a menu shown on the display 22 may be traversed ("scrolled through"). When the rotary-push actuator 40 is pressed, a certain menu item is selected.

The rotary-push actuator 40 comprises a transmitter element 42, which is arranged on a first side 20.1 (outer side) of the housing 24 of the measuring transducer 20. The housing 24 or the housing wall is closed and thus without openings, bores, holes, etc.

The rotary-push actuator 40 comprises a rotary actuator 45, which is also arranged on the first side 20.1 of the housing 24. The rotary actuator 45 is rotatable around its longitudinal axis 140. The rotary actuator 45 comprises at least one first magnetic element 46 arranged away from the longitudinal axis 140.

The rotary actuator 45 and the transmitter element 42 are arranged one inside the other, i.e. concentrically. In this case, the rotary actuator 45 is located on the outside with a hole for the transmitter element 42, which is arranged on the inside.

The measuring transducer 20 comprises an evaluation device 71, which is arranged on the inner side 20.2 of the housing 24. An axial movement of the transmitter element 42 and a rotational movement of the rotary actuator 45 can be detected with the evaluation device 71.

There are various possibilities for detecting the rotational movement, which are explained in the following.

In one embodiment, the evaluation device 71 comprises at least one Hall effect sensor, wherein the Hall effect sensor directly detects the rotational movement by means of the first magnetic element 46.

The rotational movement of the cap 50 is transmitted to the rotary actuator 45 via the transmitter element 42. The rotational movement of the rotary actuator 45 is transmitted downward via magnets 46 ("first magnetic elements") integrated therein. The axial pushing movement of the cap 50 is transmitted to the magnet 51 via the transmitter element 42; see below.

The sleeve 49 is arranged around the transmitter element 42. The sleeve 49 is shaped in such a manner that the transmitter element 42 and the rotary actuator 45 are held in the functional area. The sleeve 49 has a groove, chamfer or the like in order to lock it with the first side 20.1 of the housing 24. Thus, the cap 50, the transmitter element 42 and the rotary actuator 45 along with the respective magnets 46 and 51 are thus movable in the case of the rotary-push actuator 40.

In one embodiment, the transmitter element 42 has the effect that an axial movement of the rotary actuator 45 is also achieved with an axial movement of the cap 50. An axial movement of the rotary-push actuator 40 is then detected by means of the Hall effect sensor 52.

In one embodiment, the rotary-push actuator 40 comprises a rotary disk 41, which is arranged on the second side 20.2 (inner side) of the housing 24. The rotary disk 41 comprises at least one second magnetic element 47. This is shown in FIG. 2.

In one embodiment, the rotary disk 41 is extended into the interior of the housing 24 (not shown). The extension is effected by an axle which is attached to the rotary disk 41 and which is directed into the interior of the housing 24. An additional rotary disk is arranged on the end of the axle that is inside the housing.

The first or second magnetic element 46, 47 is configured as a magnet, for instance as a permanent magnet. Both elements 46, 47 can also be configured as magnets, for instance as permanent magnets.

The first and second magnetic elements 46, 47 are arranged opposite each other such that they form a magnetic coupling, so that a movement of the rotary actuator 45 causes a rotation of the rotary disk 41.

The transmitter element 42 is cylindrical and the rotary disk 41 is disk-shaped. The magnetic elements 46, 47 are arranged at a regular angular distance from each other, for instance four first or second elements at an angle of 90° or six first or second elements at an angle of 60°.

At its end region on the housing side, the transmitter element 42 comprises an elastic element 48, especially a compression spring, for example a coil spring as a cylindrical spring or cone spring, which displaces the transmitter element 42 axially into an initial position if no pressure is applied from the outside, for example by the user.

The transmitter element 42 comprises a magnet 51, especially a permanent magnet. On the opposite side, i.e. in the housing 24, and opposite the magnet 51, a magnetic sensor 52, for example a Hall-effect sensor, is arranged which detects an axial movement, especially against a spring force of the elastic element 48, of the transmitter element 42.

The transmitter element 42 is thus held in a rest position with the aid of a spring element 48. By actuating the cap 50 from the outside, the transmitter element 42 is moved to an end position. The position of the transmitter element 42 is determined via a magnet 51 integrated therein and a Hall effect sensor 52 positioned within the housing. There have been several different possibilities for realizing the spring element 48 and the associated restoring force, for example by disk springs, spiral springs, rubber elements or an elastic key body.

The rotational movement of the rotary-push actuator 40 is thus transferred via a magnetic coupling between the transmitter element 42 and the inner rotary disk 41. The angle of rotation of the inner rotary disk 41 can be determined by various scanning methods, for example electromechanically, for instance via sliding contacts, optically, capacitively, inductively or magnetically; see below.

A printed circuit board 70 is arranged on the inner side 20.2 of the measuring transducer 20. This can be seen, for instance, in FIG. 3b.

Bearing means for bearings, for instance for a ball bearing, for mounting the rotary disk 41 are also located on the inner side 20.2 of the measuring transducer 20.

The various possibilities for reading out the angle of rotation with the corresponding components are likewise arranged on the printed circuit board 70. An evaluation device 71 is thus arranged on the printed circuit board 70. For this purpose, the evaluation device 71 comprises at least one rotational movement sensor for which there are various embodiments.

In one embodiment, the rotary disk 41 comprises first sliding contacts, wherein the rotational movement sensor comprises second sliding contacts. The evaluation device 71 detects a movement of the rotary disk 41 through the first and second sliding contacts when they slide over each other upon a movement of the rotary disk 41.

For this purpose, the evaluation device 71 comprises, for instance, an electronic evaluation circuit, for example also a microcontroller. This also applies to the embodiments below.

In general, the rotary disk 41 moves relative to the printed circuit board 70 or to the evaluation device 71 with the rotational movement sensor.

In one embodiment, the rotary disk 41 comprises first capacitive elements, wherein the rotational movement sensor comprises second capacitive elements, wherein the first and second capacitive elements form electrodes of a plate capacitor. The evaluation device 71 detects a change in the capacitance of the plate capacitor upon a movement of the rotary disk 41.

Figure 5A:
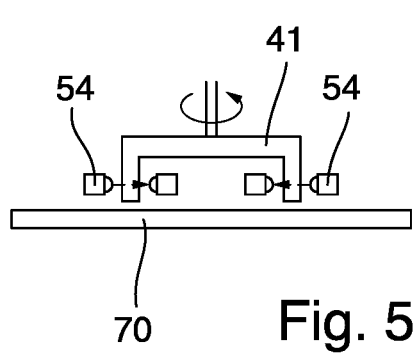
FIGS. 5a-5c show an embodiment with optical determination of a rotational movement.
Figure 5B:
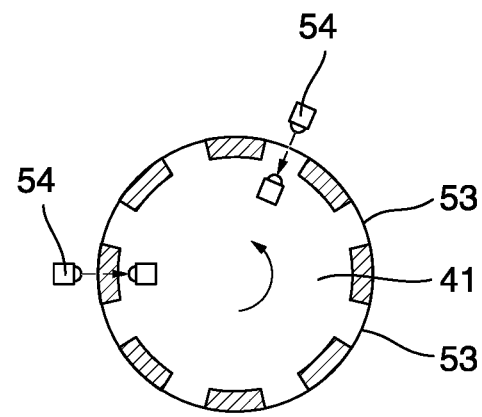
Figure 5C:
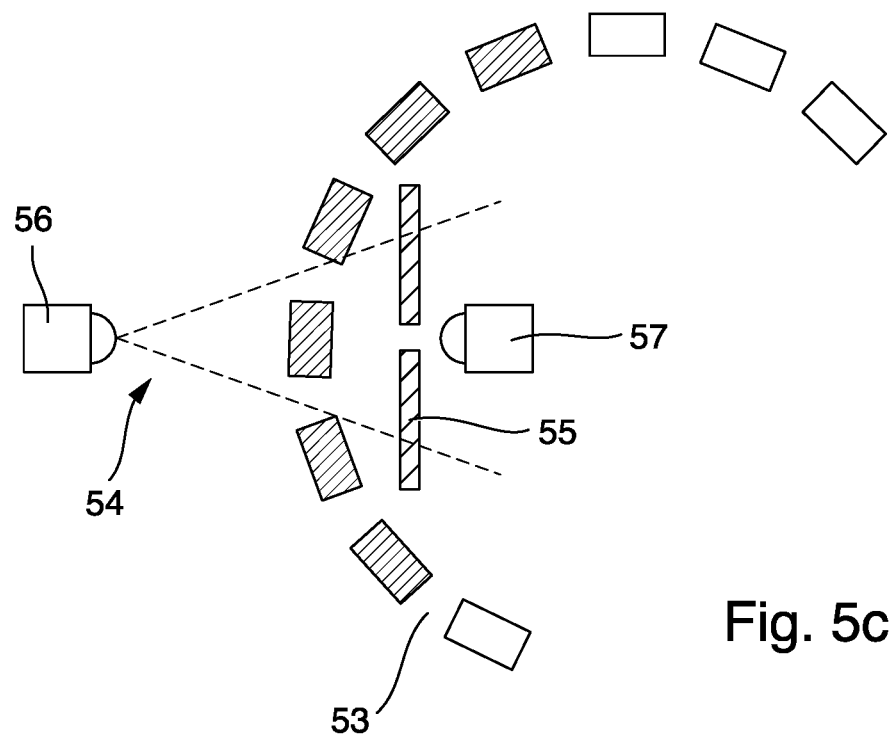

FIGS. 5a-c show an embodiment wherein the rotary disk 41 is perforated multiple times along the circumference (reference sign 53). FIG. 5a shows a side view, FIG. 5b the plan view, and FIG. 5c an additional plan view. At least one light barrier 54 is arranged on the printed circuit board 70 as a rotational movement sensor, preferably two light barriers, which is/are associated with the through holes 53, wherein this is arranged in such a manner that the through holes 53 are permeable by means of the light barrier 54. The light barrier 54 comprises an LED 56 and a photoreceiver 57 associated with the LED 56. The evaluation device 71 detects a movement of the rotary disk 41 by means of the through holes 53 and the light barrier 54. The through holes 53 are configured by means of substantially cuboid blocks arranged, especially regularly, along the circumference of the rotary wheel 41. In one embodiment, each block comprises a slotted aperture. In addition, apertures 55 are provided in one embodiment.

Figure 6A:
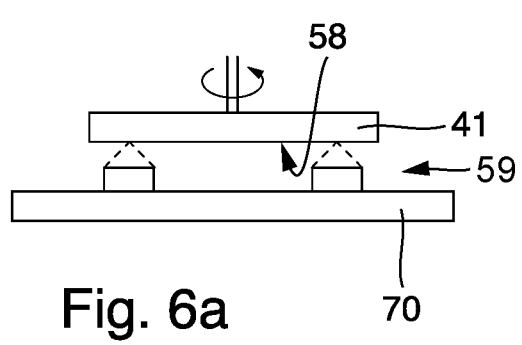
FIGS. 6a-6c show an embodiment with optical determination of a rotational movement.
Figure 6B:
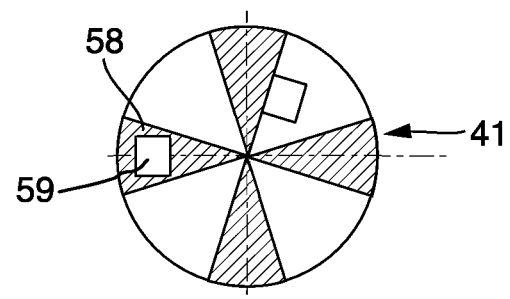
Figure 6C:
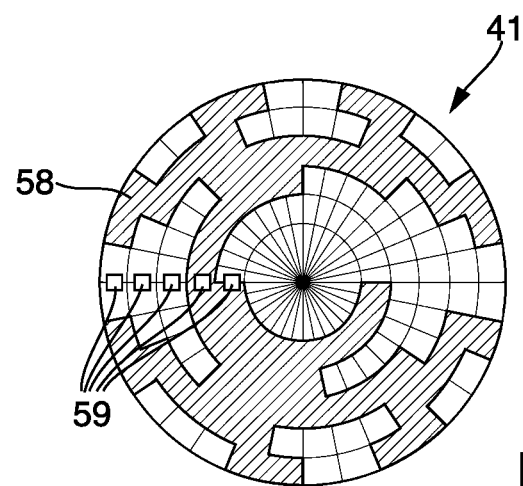

FIGS. 6a-c show one embodiment wherein the rotary disk 41 comprises a plurality of reflective elements 58. FIG. 6a shows a side view, FIG. 6b the plan view, and FIG. 6c an additional plan view with a Gray encoding. At least one reflection light barrier 59 is arranged on the printed circuit board 70 as a rotational movement sensor, preferably at least two reflection light barriers 59. The readout circuit 71 is arranged on the printed circuit board 70, by means of which a movement of the rotary disk 41 can be detected by means of the relative movement of the reflective elements 58 relative to the reflection light barrier 59. FIG. 6b shows an encoding with a Siemens star pattern (digital quadrature signal encoding); in FIG. 6c, the reflective elements 58 are arranged in a manner that results in a Gray encoding.

Figure 7A:
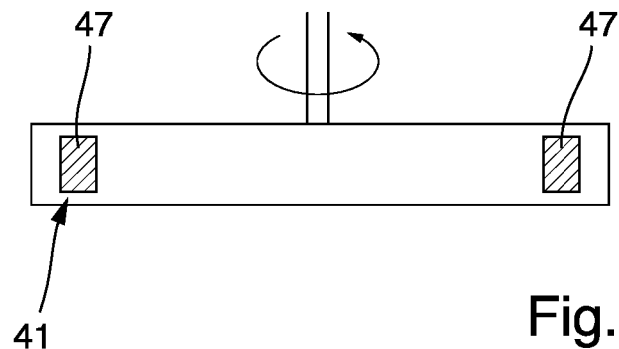
FIGS. 7a-7b show an embodiment with magnetic determination of a rotational movement.
Figure 7B:
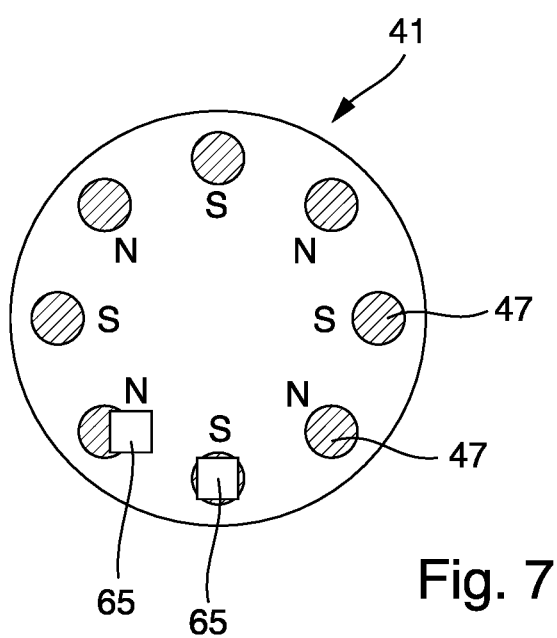

FIGS. 7a-7b show an embodiment of the evaluation of the rotational movement of the rotary disk 41. FIG. 7a shows a side view, FIG. 7b a plan view. At least one magnetic sensor 65 is arranged on the printed circuit board 70 as a rotational movement sensor, for example a Hall effect sensor. In FIG. 7b, two magnetic sensors 65 are depicted schematically opposite the second magnetic elements 47. Eight magnetic elements are depicted, and an embodiment with four magnetic elements as in FIG. 2 is likewise possible. The magnets 47 are alternately arranged with the polarity denoted by "N" and "S," respectively. Movement of the rotary disk 41 by means of the second magnetic element 47 and the magnetic sensor 65 is detected by means of the evaluation device 71. This results in an analog quadrature signal encoding. The second magnetic element 47 thus assumes a dual function, namely for encoding and for transmitting the movement of the transmitter element 42 or its magnets 46.

Furthermore, it is possible for the rotary disk 41 to comprise at least one third magnetic element 66, especially a magnet, preferably a permanent magnet. The evaluation device 71 detects a movement of the rotary disk 41 by means of the third magnetic element 66 and the magnetic sensor 65. For example, second and third magnetic elements 47, 66 are alternately arranged. In this embodiment, the second magnetic element has no dual function. In FIG. 7b, a magnetic element with the reference sign 66 is shown. In the embodiment described in the previous paragraph, only "second magnetic elements 47" are used.

In principle, the sensors with optical, capacitive and magnetic scanning methods require energy for operation. Since the system is also used in measuring transducers that are highly limited in terms of power, a periodic power supply of the required sensor elements can be used with very short operating phases, i.e. the power supply in the form of needle pulses, in order to reduce the average power consumption.

The measuring transducer 20 further comprises one or more push-button actuators 60 arranged separate from the rotary-push actuator 40. The structure of the push-button actuator 60 can be configured identically to the rotary-push actuator 40; then, the element 60 can also be referred to as a "rotary-push actuator." The keys 61 are held in a rest position with the aid of a spring element 62. By actuating the key 61 from the outside, the key body is moved to an end position. The position of the key body is determined via a magnet integrated therein and a Hall effect sensor 63 positioned within the housing. The Hall effect sensor is located on the printed circuit board 70, see FIGS. 3a and 3b, or in an enlarged illustration in FIG. 4, where only one of the push-button actuators 60 is provided with reference signs there.

This results in a hermetically sealed solution for keys and rotary-push switches.

The invention claimed is:

1. An electronic device comprising:
 a housing having a housing wall;
 a rotary-push actuator including:
  a transmitter element arranged on a first side of the housing wall; and
  a rotary actuator rotatable around an axis of rotation, wherein the rotary actuator is arranged on the first side of the housing wall,
   wherein the rotary actuator includes a first magnetic element arranged away from the axis of rotation;
 a rotary disk arranged on a second side of the housing wall,
  wherein the rotary disk includes a second magnetic element,
  wherein the first magnetic element and the second magnetic element is each a permanent magnet, and
  wherein the first and second magnetic elements are arranged opposite each other and form a magnetic coupling such that a rotation of the rotary actuator causes a rotation of the rotary disk; and
 an evaluation device arranged on the second side of the housing wall,
 wherein the evaluation device is configured such that the evaluation device detects an axial movement of the transmitter element and a rotational movement of the rotary actuator relative to the evaluation device.

2. The electronic device according to claim 1,
 wherein the transmitter element and the rotary actuator are configured in relation to each other such that a rotational movement of the transmitter element causes the rotational movement of the rotary actuator.

3. The electronic device according to claim 1, further comprising:
 a push-button actuator that is separate from the rotary-push actuator and that is arranged on the first side of the housing wall.

4. The electronic device according to claim 1, further comprising:
 an elastic element arranged on the end region of the transmitter element on the first side of the housing such that the elastic element displaces the transmitter element axially into an initial position.

5. The electronic device according to claim 1,
 wherein the transmitter element includes a permanent magnet, and wherein the evaluation device includes a magnetic sensor arranged on the second side of the housing wall and opposite the permanent magnet and the magnetic sensor detects the axial movement of the transmitter element.

6. The electronic device according to claim 1,
 wherein the evaluation device includes a Hall effect sensor, wherein the Hall effect sensor detects the axial movement of the transmitter element and the rotational movement of the rotary actuator by means of the first magnetic element.

7. The electronic device according to claim 1,
 wherein the rotary actuator and the rotary disk are disk-shaped and in each case a plurality of first and second magnetic elements are arranged at a regular angular distance from one another.

8. The electronic device according to claim 1,
 wherein the evaluation device further includes a rotational movement sensor, wherein the rotational movement sensor detects the rotational movement of the rotary disk.

9. The electronic device according to claim 8,
 wherein the rotary disk includes first sliding contacts,
 wherein the rotational movement sensor includes second sliding contacts, and
 wherein the evaluation device detects a movement of the rotary disk by means of the first and second sliding contacts when they slide over each other.

10. The electronic device according to claim 8,
 wherein the rotary disk is perforated several times along the circumference with through holes,
 wherein the rotational movement sensor incudes a light barrier,
 wherein the light barrier is associated with the through holes and is arranged such that the through holes are permeable by means of the light barrier, and
 wherein the evaluation device detects a movement of the rotary disk by means of the through holes and the light barrier.

11. The electronic device according to claim 10,
 wherein the through holes are configured by means of cuboid blocks regularly arranged along the circumference of the rotary disk.

12. The electronic device according to claim 8,
 wherein the rotary disk includes a plurality of reflective elements,
 wherein the rotational movement sensor includes a reflection light barrier, and
 wherein the evaluation device detects a movement of the rotary disk by means of the reflective elements and the reflection light barrier.

13. The electronic device according to claim 8,
 wherein the rotational movement sensor includes a magnetic sensor,
 wherein the evaluation device detects a movement of the rotary disk by means of the second magnetic element and the magnetic sensor.

14. The electronic device according to claim 13,
 wherein the rotary disk includes a third magnetic element,
 wherein the rotational movement sensor includes a magnetic sensor, and
 wherein the evaluation device detects a movement of the rotary disk by means of the third magnetic element and the magnetic sensor.

15. The electronic device according to claim 8,
 wherein the rotational movement sensor is configured such that a Gray encoding can be read out.

16. The electronic device according to claim 8, wherein the rotational movement sensor is configured in such a manner that an analog, quadrature signal encoding can be read out.

* * * * *